(12) United States Patent
Gill et al.

(10) Patent No.: US 7,518,427 B2
(45) Date of Patent: Apr. 14, 2009

(54) APPARATUS, SYSTEM, AND METHOD FOR HARDENED LATCH

(75) Inventors: Balkaran Gill, Hillsboro, OR (US); Norbert Roland Seifert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/613,618

(22) Filed: Dec. 20, 2006

(65) Prior Publication Data
US 2008/0150602 A1  Jun. 26, 2008

(51) Int. Cl.
*H03K 3/00* (2006.01)
(52) U.S. Cl. .................. 327/218; 327/215; 327/225
(58) Field of Classification Search .......... 327/199–225
See application file for complete search history.

(56) References Cited

U.S. PATENT DOCUMENTS

| 6,097,230 | A  | * | 8/2000 | Bareither | 327/202 |
| 6,492,857 | B2 | * | 12/2002 | Shuler, Jr. | 327/225 |
| 7,038,515 | B2 | * | 5/2006 | Rusu et al. | 327/208 |
| 7,142,004 | B2 | * | 11/2006 | Calrson | 326/14 |
| 7,212,056 | B1 | * | 5/2007 | Belov | 327/210 |

* cited by examiner

*Primary Examiner*—Kenneth B Wells
*Assistant Examiner*—John W Poos
(74) *Attorney, Agent, or Firm*—Schwegman, Lundberg & Woessner, P.A.

(57) ABSTRACT

Various embodiments include a latch having a node to receive input information, and a first pseudo-inverter with a first input node, a second input node, and an output node to generate output information based on information at the first and second input nodes. The latch may have a feedback circuit to generate feedback information based on at least the output information. The latch may also have a select circuit to selectively transfer the input information and the feedback information to the first and second input nodes. Other embodiments including additional apparatus, systems, and methods are disclosed.

18 Claims, 7 Drawing Sheets

APPARATUS, SYSTEM, AND METHOD FOR HARDENED LATCH

FIELD

Embodiments of this disclosure relate to integrated circuits, including storage elements.

BACKGROUND

Storage elements such as latches reside in circuitry of many electronic devices. A latch may be used to store information, transfer information, or both. In some situations, the value of the information in the latch may be unintentionally changed due to factors such as charged particles, which may be generated by cosmic rays or radioactive decay of elements. The unintentional change in value may create false information in the latch. Therefore, some latches may be affected by factors that may create false information, leading to potential device failure or unreliable device performance.

DETAILED DESCRIPTION

Figure 1:
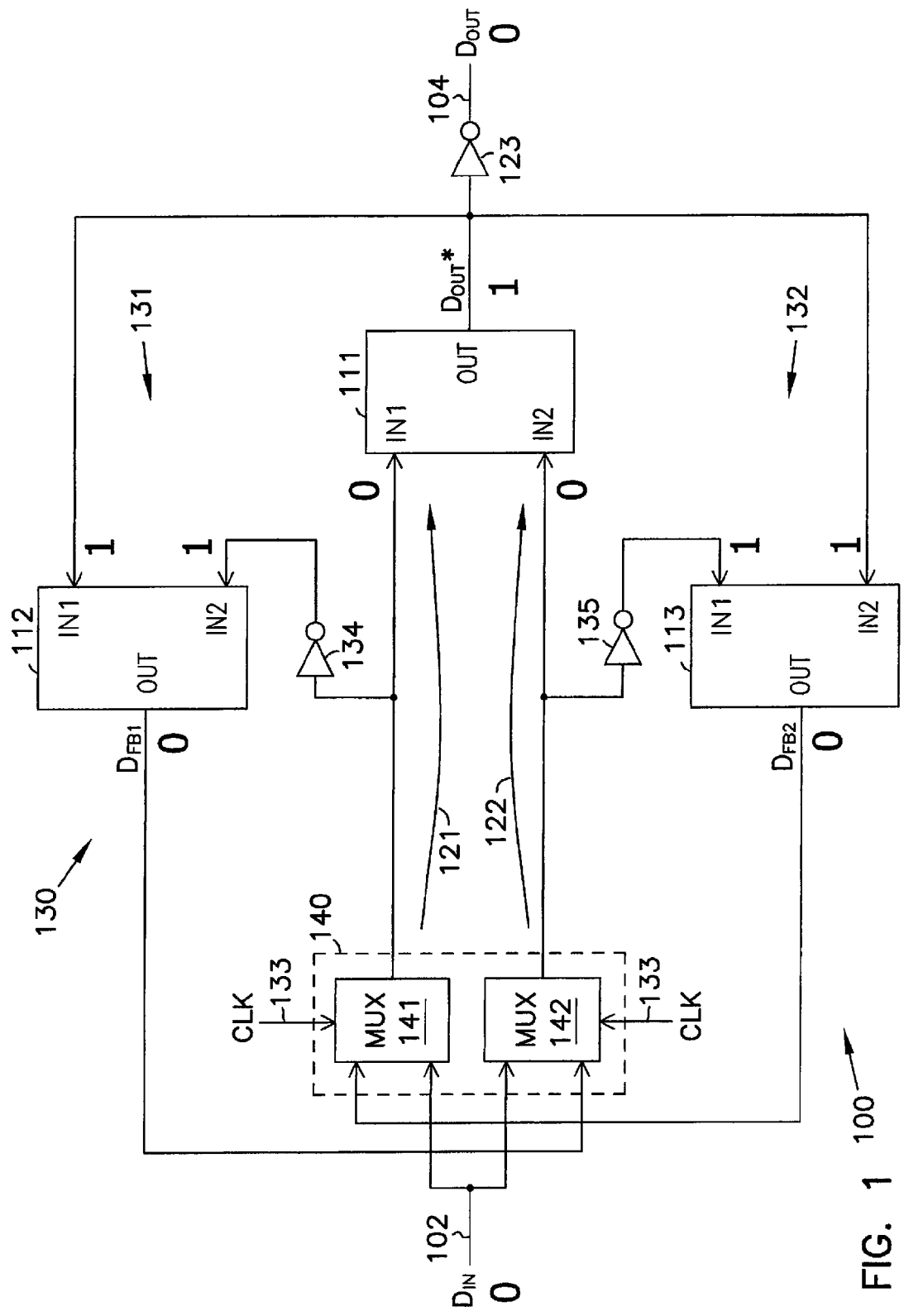
FIG. 1 shows a latch according to an embodiment of the invention.

FIG. 1 shows a latch 100 according to an embodiment of the invention. Latch 100 may include a circuit node 102 to receive input information $D_{IN}$, and a latch node 104 to provide latch information $D_{OUT}$, which may be a version of $D_{IN}$. In some embodiments, latch 100 may be included in a device such that $D_{IN}$ may represent information from memory or registers of the device. Latch 100 may also be included in sequential or combinational logic circuitry of a device.

Figure 2:
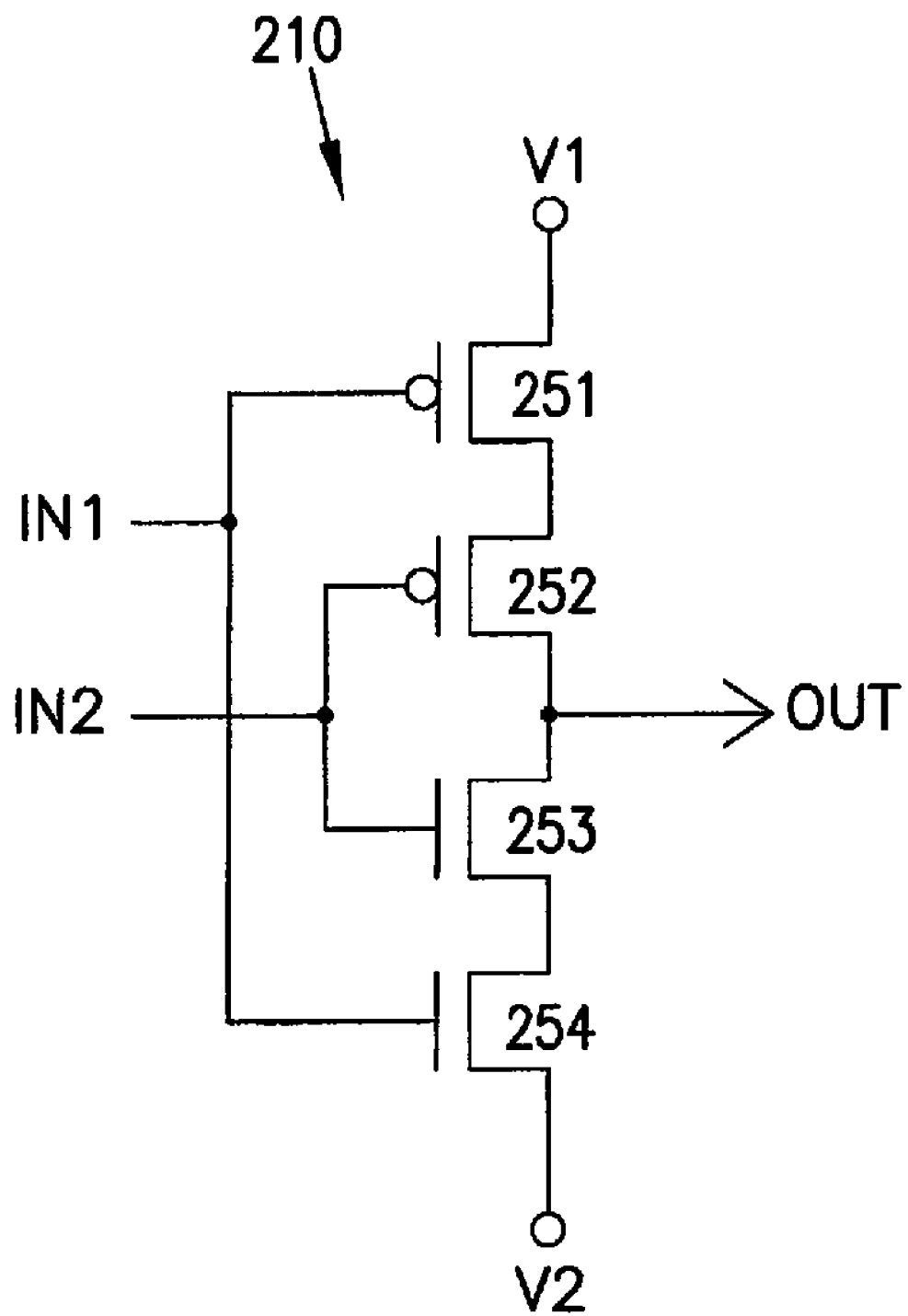
FIG. 2 shows an example embodiment of a pseudo-inverter, which may be used in the latch of FIG. 1.

In FIG. 1, latch 100 may include a number of pseudo-inverters 111, 112, and 113, each having input nodes IN1 and IN2, and an output node OUT. FIG. 2 shows an example embodiment of a pseudo-inverter, which may be used in one or more of pseudo-inverters 111, 112, and 113 of FIG. 1.

The operation of each of pseudo-inverters 111, 112, and 113 of FIG. 1 may be summarized in Table 1.

TABLE 1

| IN1 | IN2 | OUT |
|---|---|---|
| 0 | 0 | 1 |
| 1 | 1 | 0 |
| 0 | 1 | previous value retained |
| 1 | 0 | previous value retained |

As shown in Table 1, when both IN1 and IN2 have the same value (e.g., both have binary "0"), OUT has a value (e.g., binary "1") that is inverted from the value at both IN1 and IN2. When IN1 and IN2 have different or unequal values (a mix of "0" and "1"), the previous value of OUT (either "0" or "1") is retained. Thus, each of pseudo-inverters 111, 112, and 113 of FIG. 1 may operate as an inverter when both IN1 and IN2 have the same value, and retain the previous value when IN1 and IN2 have different values.

In FIG. 1, latch 100 may include a select circuit 140. During a transparent mode of latch 100, select circuit 140 may selectively transfer $D_{IN}$ to pseudo-inverter 111 via input paths 121 and 122. Pseudo-inverter 111 may be adapted to generate output information $D_{OUT}^*$ based on $D_{IN}$. An inverter 123 may provide $D_{OUT}^*$ to latch node 104 as $D_{OUT}$. Thus, during the transparent mode, the value of the $D_{OUT}^*$ and $D_{OUT}$ may change based on the value of on $D_{IN}$. During a store mode of latch 100, select circuit 140 may selectively transfer feedback information $D_{FB1}$ and $D_{FB2}$ to pseudo-inverter 111 via input paths 121 and 122. Pseudo-inverter 111, based on $D_{FB1}$ and $D_{FB2}$, may retain the value of $D_{OUT}^*$ captured in the previous transparent mode. Thus, the store mode, the value of $D_{OUT}^*$ captured in the previous transparent mode may be retained.

Select circuit 140 may include a multiplexer (MUX) 141 and MUX 142 to transfer to IN1 and IN2 of pseudo-inverter 111 either $D_{IN}$ during the transparent mode or $D_{FB1}$ and $D_{FB2}$ during the store mode. Latch 100 may be in the transparent mode when clock information CLK received at node 133 has one value, and in the store mode when CLK has another value.

Each of $D_{IN}$, $D_{OUT}^*$, $D_{OUT}$, $D_{FB1}$, $D_{FB2}$, and CLK may include a signal having different signal values or signal levels. The signal values may represent a binary 0 value (logic zero) and a binary 1 value (logic one). Thus, in some embodiments, the value of each of $D_{IN}$, $D_{OUT}^*$, $D_{OUT}$, $D_{FB1}$, $D_{FB2}$, and CLK may include either a binary 0 value or a binary 1 value.

As shown in FIG. 1, feedback circuit 130 may include feedback paths 131 and 132. Pseudo-inverter 112 may be located on a feedback path 131 to generate a first copy of the feedback information $D_{FB1}$ based on both $D_{OUT}^*$ and the information on input path 121. An inverter 134 provides an inversion of the information on input path 121 to IN2 of pseudo-inverter 112, such that the value of $D_{FB1}$ in the store mode may correspond to the value of $D_{IN}$ during a previous transparent mode.

Pseudo-inverter 113 may be located on a feedback path 132 to generate a second copy of the feedback information $D_{FB2}$ based on both $D_{OUT}^*$ and the information on input path 122. An inverter 135 provides an inversion of the information on input path 122 to IN1 of pseudo-inverter 113 such that the value of $D_{FB2}$ in the store mode may correspond to the value of $D_{IN}$ during the previous transparent mode.

In the description herein, an inversion of the information may refer to a value that is inverted or opposite from the value of the information. For example, if the information has a value of binary 1, then the inversion of the information has a value of binary 0, and vice versa.

For ease of following the description of the operation of latch 100, FIG. 1 shows an example where information may be transferred throughout latch 100 when $D_{IN}$ has a value of binary 0 (shown in FIG. 1 as "0"). In a situation where $D_{IN}$ may have a value of binary 1, "0" in FIG. 1 may be replaced with "1", and "1" in FIG. 1 may be replaced with "0".

The values of "0" and "1" as shown in FIG. 1 may occur in both of the transparent and store modes of latch 100. As shown in FIG. 1, during the transparent mode, select circuit 140 may select "0" from $D_{IN}$ and transfer "0" to IN1 and IN2 of pseudo-inverter 111. Pseudo-inverter 111 may perform its inverting function (Table 1) and generate "1" for $D_{OUT}^*$ based on "0" from each of IN1 and IN2. Inverter 123 may generate "0" for $D_{OUT}$ based on "1" from $D_{OUT}*$. Thus, during the transparent mode, "1" at $D_{OUT}*$ is an inversion of "0" at $D_{IN}$, and "0" at $D_{OUT}$ corresponds to "0" from $D_{IN}$.

As mentioned above, in the store mode, latch 100 may retain or store the value of $D_{OUT}*$ captured in the previous transparent mode. In FIG. 1, since $D_{OUT}*$ in the transparent mode has an example value of "0", latch 100 may retain "0" at $D_{OUT}*$ during the store mode. The operation of latch 100 in the store mode may be summarized as follows. In the store mode, select circuit 140 may select "0" from each of $D_{FB1}$ and $D_{FB2}$ and transfer them to IN1 and IN2 of pseudo-inverter 111. Since both of IN1 and IN2 have the same value of "0" (based on "0" from $D_{FB1}$ and "0" from $D_{FB2}$), the value at $D_{OUT}*$ may be retained at "1", which is the same value as the previous value of $D_{OUT}*$ ("1") during the previous transparent mode described above.

The example above shows that latch 100 may transfer the $D_{IN}$ during the transparent mode and retain the value of $D_{IN}$ (presented by $D_{OUT}*$) during the store mode.

As mentioned above, some factors may unintentionally change a value of information in a latch. Latch 100 may be called a hardened latch, in that an unintentional change in value at a node within latch 100 during a store mode may not alter the value of $D_{OUT}*$ or $D_{OUT}$. For example, in FIG. 1 during a store mode, when the value of the information on input path 121 (e.g., information at IN1 of pseudo-inverter 111) is unintentionally changed to "1" while IN2 on input path 122 maintains at "0", the value of $D_{OUT}*$ may not be altered but may be retained at the previous value of "1" because IN1 (if changed to "1") and IN2 ("0" as shown in FIG. 1) have different values. Thus, in this example, an unintentional change in the value at a node on input path 121 may not alter the value of $D_{OUT}*$ or $D_{OUT}$. Similarly, during a store mode, an unintentional change in value at another node (e.g., at OUT of pseudo-inverter 112 or 113) within latch 100 may not alter the value of $D_{OUT}*$ or $D_{OUT}$.

FIG. 1 shows an example where latch 100 may include two feedback paths 131 and 132. In some embodiments, one of feedback paths 131 and 132 may be omitted from latch 100. For example, feedback path 131, including pseudo-inverter 112 and inverter 134, may be omitted from latch 100, and $D_{FB2}$ from feedback path 132 may be provided to both MUX 141 and MUX 142. In another example, feedback path 132, including pseudo-inverter 113 and inverter 135, may be omitted from latch 100, and $D_{FB1}$ from feedback path 131 may be provided to both MUX 141 and MUX 142.

FIG. 2 shows an example embodiment of a pseudo-inverter 210, which may be used in one or more of pseudo-inverters 111, 112, and 113 of FIG. 1. In FIG. 2, pseudo-inverter 210 may include transistors 251, 252, 253, and 254 coupled between supply nodes with corresponding power or voltages V1 and V2. Transistors 251 and 252 may include p-channel transistors, and transistors 253 and 254 may include n-channel transistors. V1 may be a supply voltage for pseudo-inverter 210 and V2 may be ground. In some embodiments, V1 and V2 may be provided by a battery. In FIG. 2, IN1, IN2, and OUT correspond to first input node, second input node, and an output node of pseudo-inverter 210. The operation of pseudo-inverter 210 may be summarized in Table 1 described above.

Figure 3:
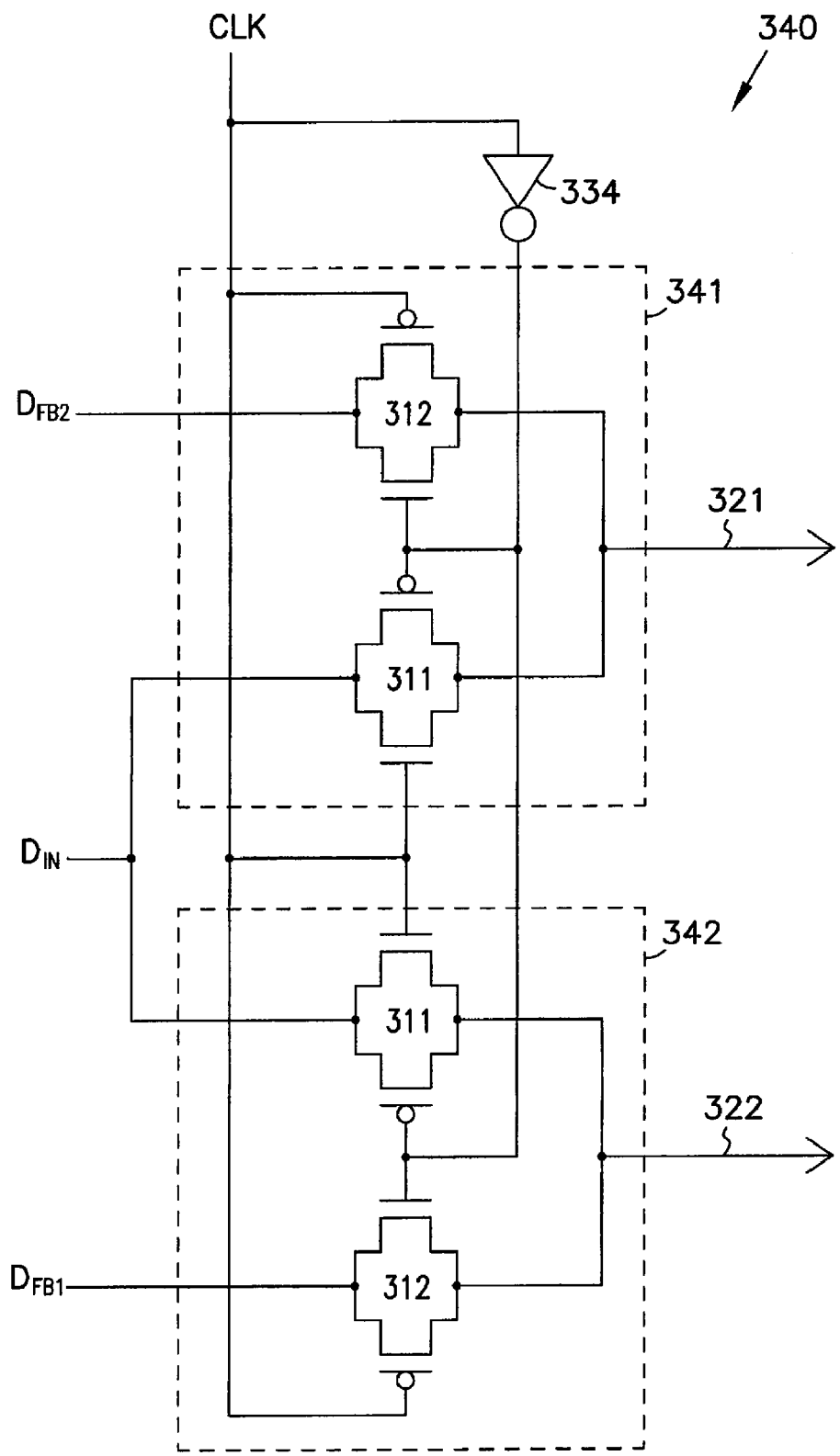
FIG. 3 shows a select circuit according to an embodiment of the invention.

FIG. 3 shows a select circuit 340 according to an embodiment of the invention. Select circuit 340 may be used in select circuit 140 of FIG. 1. In FIG. 3, select circuit 340 may include a MUX 341 and a MUX 342; both are responsive to clock information CLK to transfer either input information $D_{IN}$ or feedback information $D_{FB1}$ and $D_{FB2}$ to paths 321 and 322.

Paths 321 and 322 may be coupled to input nodes of a pseudo-inverter such as input nodes IN1 and IN2 of pseudo-inverter 111 of FIG. 1.

In FIG. 3, each of MUX 341 and MUX 342 may include a pass gate 311 and a pass gate 312. An inverter 334 may enable select circuit 340 to use CLK to turn on only one of pass gates 311 and 312 in each of MUX 341 and MUX 342 at a time, such that only $D_{IN}$ or only $D_{FB1}$ and $D_{FB2}$ may be selected and transferred to paths 321 and 322. For example, when CLK has a first value (e.g., in a transparent mode), both MUX 341 and MUX 342 may select $D_{IN}$ among $D_{IN}$, $D_{FB1}$, and $D_{FB2}$ and transfer $D_{IN}$ to paths 321 and 322 through pass gates 311. In another example, when CLK has a second value (e.g., in a store mode), MUX 341 may select $D_{FB2}$ between $D_{IN}$ and $D_{FB2}$ and transfer $D_{FB2}$ to path 321 through pass gate 312 of MUX 341, and MUX 342 may select $D_{FB1}$ between $D_{IN}$ and $D_{FB1}$ and transfer $D_{FB1}$ to path 322 through pass gate 312 of MUX 342. In some embodiments, $D_{FB1}$ may be coupled to MUX 341 such that MUX 341 may select between $D_{IN}$ and $D_{FB1}$ (instead of between $D_{IN}$ and $D_{FB2}$ as shown in FIG. 3), and $D_{FB2}$ may be coupled to MUX 342 such that MUX 342 may select between $D_{IN}$ and $D_{FB2}$ (instead of between $D_{IN}$ and $D_{FB1}$ as shown in FIG. 3).

Figure 4:
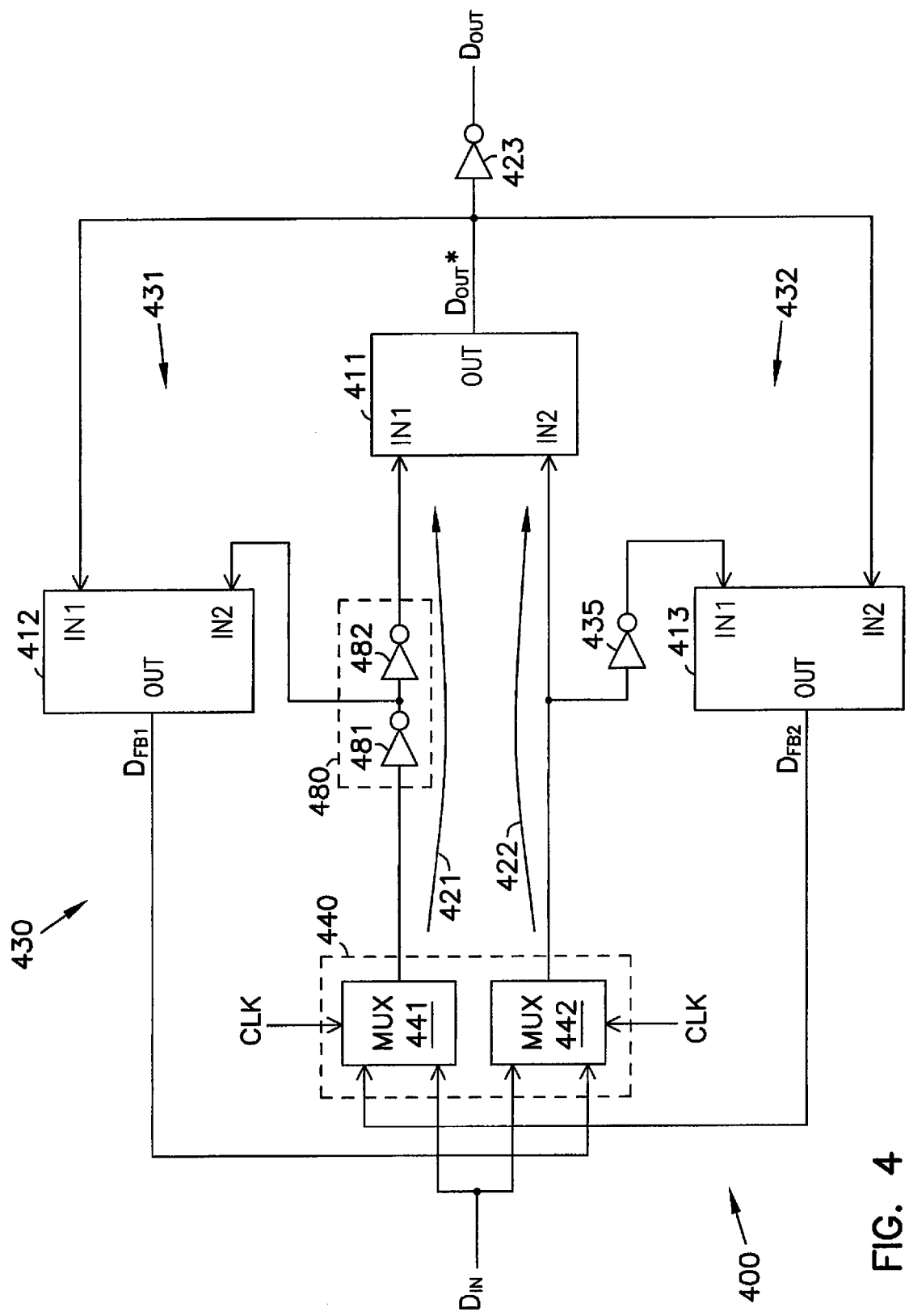
FIG. 4 shows a latch with a filter according to an embodiment of the invention.

FIG. 4 shows a latch 400 with a filter circuit 480 according to an embodiment of the invention. Latch 400 may be similar to latch 100 of FIG. 1 except for filter circuit 480 in FIG. 4. Latch 400 may include pseudo-inverter 411, 412, and 413, a feedback circuit 430 with feedback paths 431 and 432, inverters 423 and 435, select circuit 440 with MUX 441 and MUX 442, and input paths 421 and 422. Latch 400 may operate on information such as $D_{IN}$, $D_{OUT}*$, $D_{OUT}$, $D_{FB1}$ and $D_{FB2}$, and CLK. Filter circuit 480 may include inverters 481 and 482. Pseudo-inverter 412 may share inverter 481 with filter circuit 480 to receive information from input path 421.

In some embodiments, one of feedback paths 431 and 432 may be omitted from latch 400. For example, feedback path 431, including pseudo-inverter 412, may be omitted from latch 400, and $D_{FB2}$ from feedback path 432 may be provided to both MUX 441 and MUX 442. In another example, feedback path 432, including pseudo-inverter 413 and inverter 435, may be omitted from latch 400, and $D_{FB1}$ from feedback path 431 may be provided to both MUX 441 and MUX 442. In some embodiments, one or more of pseudo-inverter 411, 412, and 413 may include an embodiment of pseudo-inverter 210 of FIG. 2. In some embodiments, select circuit 440 may include an embodiment of select circuit 340 of FIG. 3.

In FIG. 4, each of input paths 421 and 422 may have a propagation delay (signal propagation delay) between select circuit 440 and pseudo-inverter 411. The propagation delay of input path 421 may correspond to a time it takes for a signal or information (e.g., $D_{IN}$ or $D_{FB2}$) to travel from select circuit 440 to IN1 of pseudo-inverter 411 on input path 421. The propagation delay of input path 422 may correspond to a time it takes for a signal or information (e.g., $D_{IN}$ or $D_{FB1}$) to travel from select circuit 440 to IN2 of pseudo-inverter 411 on input path 422.

As shown in FIG. 4, filter circuit 480 located on input path 421 may cause the number of circuit elements of input path 421 to be unequal to the number of circuit elements of input path 422. For example, input path 421 may include two circuit elements (inverters 481 and 482 from filter circuit 480) more than that of input path 422. A greater number of circuit elements in input path 421, in comparison with input path 422, may cause the propagation delay of input path 421 to be greater than the propagation delay of input path 422. The difference in the propagation delay between input paths 421 and 422 may cause information (e.g., $D_{IN}$, $D_{FB1}$, and $D_{FB2}$)

from select circuit 440 to be transferred to IN1 of pseudo-inverter 411 (via input path 421) and to IN2 of pseudo-inverter 411 (via input path 422) at different times or not simultaneously. In some embodiments, filter circuit 480 may have time delay "D" such that the difference in the propagation delays of input paths 421 and 422 is approximately equal to time delay "D".

As mentioned above, some factors may change value or create false information in a latch. The false information may take the form of a "glitch" or signal glitch. In latch 400, filter circuit 480 may block or prevent a glitch or false information from altering the value of $D_{OUT}^*$ or $D_{OUT}$.

The operation of latch 400, including the operation of filter circuit 480, is described below in connection with FIG. 5.

Figure 5:
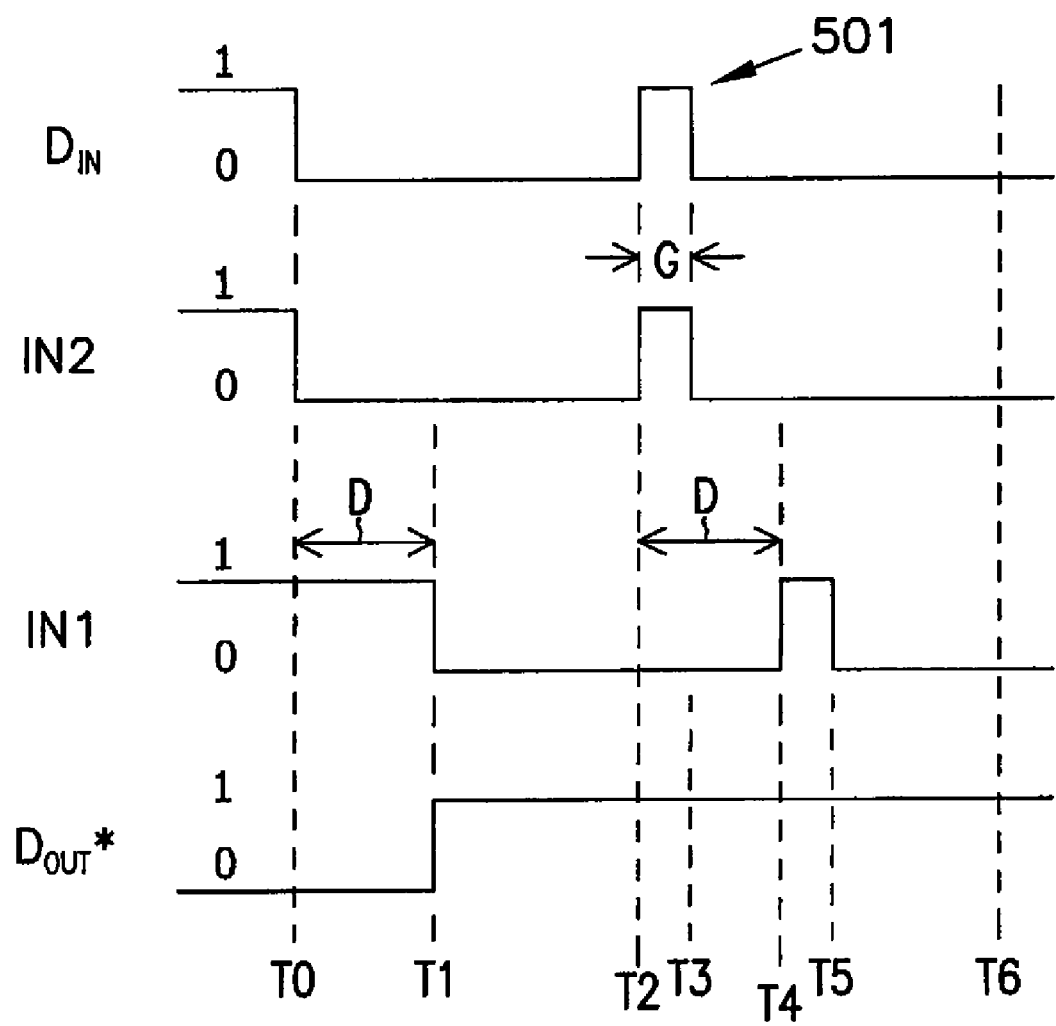
FIG. 5 is an example timing diagram for the latch of FIG. 4.

FIG. 5 is an example timing diagram for latch 400 of FIG. 4. In FIG. 5, T0, T1, T2, T3, T4, T5, and T6 represent different times. IN1 and IN2 correspond to IN1 and IN2 of pseudo-inverter 411. A glitch 501 may occur between times T2 and T3 and create false information such that $D_{IN}$ may have a false value of "1" between times T2 and T3 instead of a correct or true value of "0".

As shown in FIG. 5, although $D_{IN}$ may have a false value of "1" between times T2 and T3, the previous value of $D_{OUT}^*$ (value between times T1 and T2) may be retained at "1" between times T2 and T3 because of the function of filter circuit 480 (FIG. 4) of latch 400. If, for example, filter circuit 480 is omitted from latch 400, the false information may alter the value of $D_{OUT}^*$ between times T2 and T3 such that $D_{OUT}^*$ may have a value of "1", which is a false value in this example. The function of filter circuit 480 of FIG. 4 is described below.

In FIG. 5, "D" represents a time delay intentionally applied by filter circuit 480 to information (e.g., $D_{IN}$) on input path 421 to prevent IN and IN2 of pseudo-inverter 411 from simultaneously receiving false information so that the value of $D_{OUT}^*$ may be retained when a glitch, such as glitch 501, occurs in latch 400. "G" in FIG. 5 represents a time interval of the false information caused by glitch 501. The function of filter circuit 480 of FIG. 4 in blocking or preventing false information from altering the value of $D_{OUT}^*$ is described as follows.

Before time T0, $D_{IN}$ may have a value of "1". Thus, $D_{OUT}^*$ may have a value of "0", which is the inversion of the value of "1" of $D_{IN}$.

At time T0, the value of $D_{IN}$ may change from "1" to "0", which is a correct or true value used in the example of FIG. 5. IN2 may also change from "1" to "0" after $D_{IN}$ is transferred to IN2 via input path 422 (FIG. 4). IN1, however, may not change from "1" to "0" at the same time that IN2 does because of time delay "D" caused by filter circuit 480. Thus, IN1 may only change from "1" to "0" at time T1, which is time T0 plus time delay "D".

Between times T1 and T2, $D_{OUT}^*$ may have a value of "1" corresponding to an inversion of the true value of "0" from $D_{IN}$.

Between times T2 and T3, glitch 501 may cause $D_{IN}$ to have a false value of "1". The false value of "1" from $D_{IN}$ may arrive at IN2 at time T2. Thus, IN2 may have the false value of "1" during time interval "G" or between time T2 and T3. The false value of "1" from $D_{IN}$, however, may not arrive at IN1 at time T2 because of the time delay "D" caused by filter circuit 480. Thus, the false value of "1" occurred from $D_{IN}$ at time T2 may arrive at IN1 at time T4, which is T2 plus time delay "D".

Filter circuit 480 (FIG. 4) may be constructed or programmed such that time delay "D" may be greater than time interval "G". In FIG. 5, since "D" may be greater than "G", when the false value "1" from $D_{IN}$ arrives at IN1 at time T4, the false value "1" at IN2 may already disappear (e.g., disappear at time T3). Thus, because of filter circuit 480, the false information caused by glitch 501 may not simultaneously arrive at IN1 and IN2 of pseudo-inverter 411, thereby IN1 and IN2 of pseudo-inverter 411 may not simultaneously have the same value of the false information. As shown in FIG. 5, IN1 and IN2 may have different values between times T2 and T3, T3 and T4, and T4 and T5. Therefore, although $D_{IN}$ may have a false value of "1" between times T2 and T3, pseudo-inverter 411 may retain the previous value of $D_{OUT}^*$ between times T2 and T5 because between times T2 and T5, both IN1 and IN2 may not simultaneously have the same false value. In summary, filter circuit 480 of FIG. 4 may block or prevent false information from altering the value of $D_{OUT}^*$ when a glitch, such as glitch 501, may occur at $D_{IN}$ or at another node of latch 400.

As mentioned above, filter circuit 480 of FIG. 4 may be constructed or programmed such that time delay "D" may be greater than time interval "G". In some situations, the value of time interval "G" of a glitch, such as glitch 501, may generally be determined by one skilled in the art. Therefore, in some embodiments, filter circuit 480 may be constructed with a specific time delay "D" greater than time interval "G". FIG. 4 shows an example where filter circuit 480 may include two inverters 481 and 482. In some embodiments, the number of inverters in filter circuit 480 may vary. In some embodiments, filter circuit 480 may be a programmable filter such that time delay "D" may be adjusted, e.g., by programming actions. For example, one or more of inverters 481 and 482 may be a programmable inverter such that a time delay of the programmable inverter may by adjusted (reduced or increased) to vary time interval "D".

Figure 6:
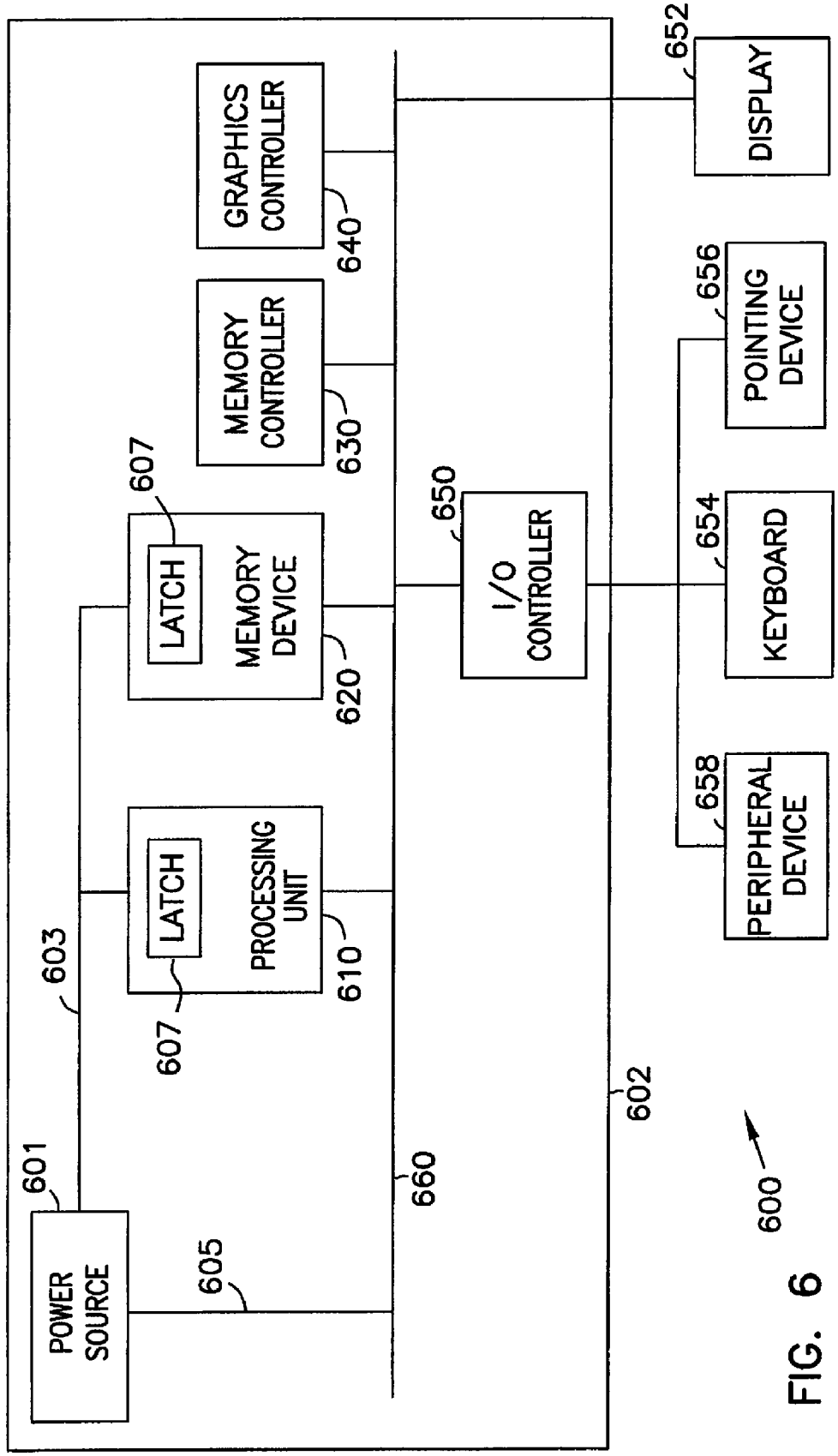
FIG. 6 shows a block diagram of a system according an embodiment of the invention.

FIG. 6 shows a block diagram of a system 600 according to an embodiment of the invention. System 600 may include a power source 601, a processing unit 610, a memory device 620, a memory controller 630, a graphics controller 640, an input and output (I/O) controller 650, a display 652, a keyboard 654, a pointing device 656, a peripheral device 658, and a bus 660. System 600 may also include a circuit board 602 on which some components of system 600 may be located, as shown in FIG. 6. Circuit board 602 may include terminals 603 and 605 coupled to a power source 601 to provide power or voltage to the components of system 600. Power source 601 may be provided by alternating current to direct current (AC to DC) converting circuitry, a battery, or others. Memory device 620 may be a volatile memory device, a non-volatile memory device, or a combination of both. For example, memory device 620 may be a dynamic random access memory (DRAM) device, a static random access memory (SRAM) device, a flash memory device, or a combination of these memory devices. I/O controller 650 may include a communication module for wired or wireless communication. In some embodiments, the number of components of system 600 may vary.

Processing unit 610 may process data transferred to and from other components via bus 660. Processing unit 610 may include a general-purpose processor or an application specific integrated circuit (ASIC). Processing unit 610 may be a single core processing unit or a multiple-core processing unit.

In some embodiments, one or more components of system 600 may include a latch such as latch 607 in processing unit 610 and in memory device 620. Latch 607 may include an embodiment of latch 100 of FIG. 1 or latch 400 of FIG. 4. Latch 607 of FIG. 6 may receive power from power source 601.

System 600 may include computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, compact disc players, DVD players, video cassette recorders, DVD recorders, camcorders, digital cameras, MP3 (Motion Picture Experts Group, Audio Layer 3) players, video games, watches, etc.), and the like.

Figure 7:
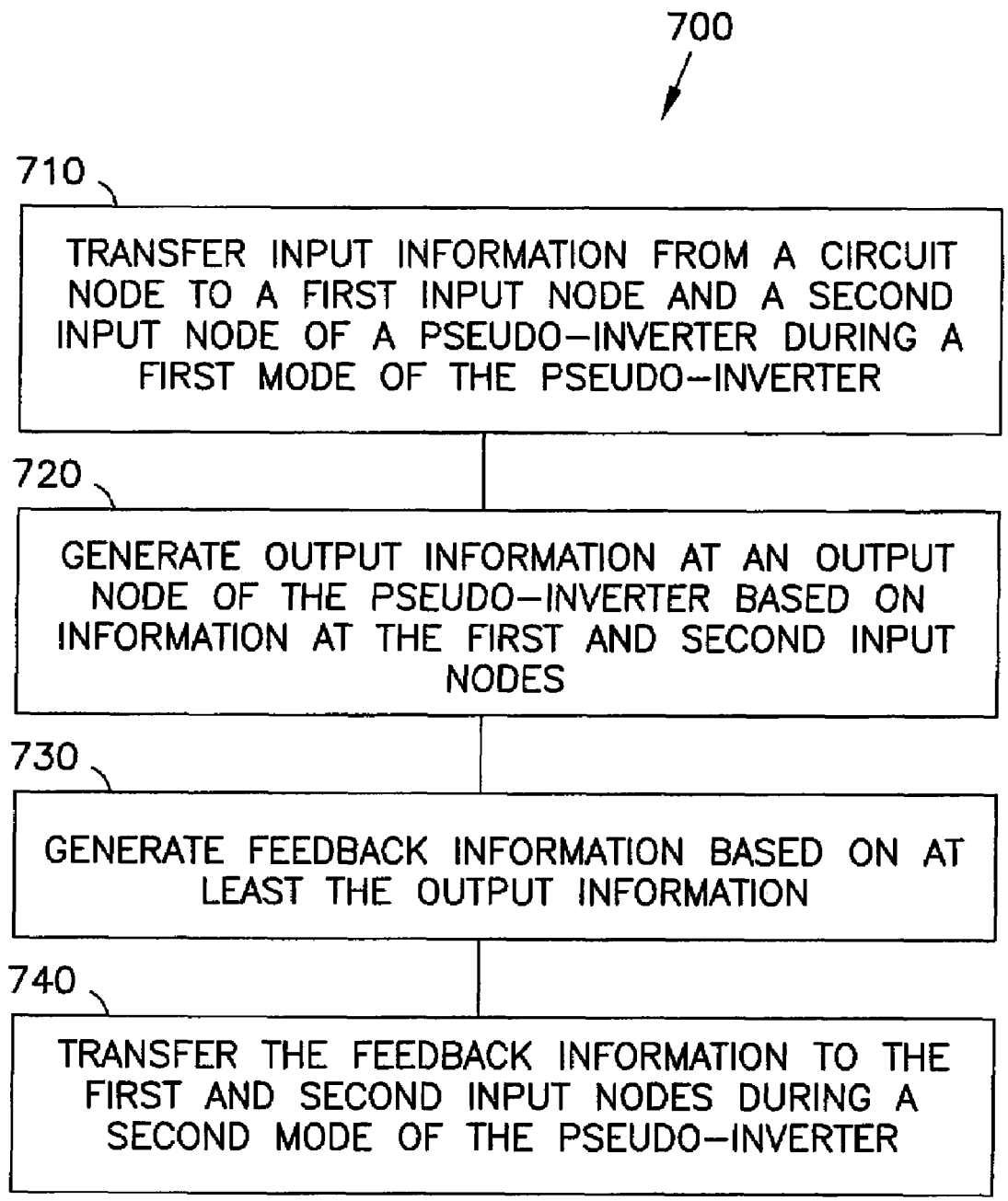
FIG. 7 is a flowchart of a method for transferring information according an embodiment of the invention.

FIG. 7 is a flowchart showing a method 700 of transferring information according to an embodiment of the invention. In some embodiments, method 700 may be used in a latch or system such as latch 100, latch 400, or system 600 described in reference to FIG. 1 through FIG. 6. Thus, in some embodiments, the circuit elements used in method 700 may include the circuit elements of the embodiments described above with reference to FIG. 1 through FIG. 6.

Method 700 of FIG. 7 may start with activity 710 to transfer input information from a circuit node to a first input node and a second input node of a pseudo-inverter during a first mode of the pseudo-inverter. Activity 720 may generate output information at an output node of the pseudo-inverter based on information at the first and second input nodes. Activity 730 may generate feedback information based on at least the output information. Activity 740 may transfer the feedback information to the first and second input nodes of the pseudo-inverter during a second mode of the pseudo-inverter.

The individual activities of method 700 may not have to be performed in the order shown or in any particular order. Some activities may be repeated, and others may occur only once. Various embodiments may have more or fewer activities than those shown in FIG. 7. For example, in some embodiments, method 700 may include the activities or operations of latches 100 and 400, and system 600 of FIG. 6 described above.

The above description and the drawings illustrate some embodiments of the invention to enable those skilled in the art to practice the embodiments of the inventions. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
    a first pseudo-inverter including a first input node, a second input node, and an output node, the first pseudo-inverter adapted to generate output information at the output node based on information coupled to the first and second input nodes;
    a feedback circuit to generate feedback information based on at least the output information, wherein, the feedback circuit includes a second pseudo-inverter having a first input node coupled to the output node of the first pseudo-inverter, a second input node coupled to one of the first and second input nodes of the first pseudo-inverter, and an output node to provide a first copy of the feedback information to the select circuit; and
    a select circuit coupled to receive input information and the feedback information and to selectively transfer the input information and the feedback information to the first and second input nodes.

2. The apparatus of claim 1 further comprising a filter circuit located on a path between the select circuit and the first pseudo-inverter to block false information from altering the output information.

3. The apparatus of claim 2, wherein the filter circuit includes at least one inverter coupled between the select circuit and the first pseudo-inverter.

4. The apparatus of claim 1, wherein the feedback circuit includes:
    a first feedback path to generate a first copy of the feedback information based on at least the output information, and to provide the first copy of the feedback information to the select circuit; and
    a second feedback path to generate a second copy of the feedback information based on at least the output information, and to provide the second copy of the feedback information to the select circuit.

5. The apparatus of claim 1, wherein the select circuit includes a node to receive clock information to transfer the input information to the first and second input nodes when the clock information has a first value, and to transfer the first and second copies of the feedback information to the first and second input nodes when the clock information has a second value.

6. The apparatus of claim 1, the feedback circuit includes a third pseudo-inverter having a first input node coupled to the output node of the first pseudo-inverter, a second input node coupled to one of the first and second input nodes of the first pseudo-inverter, and an output node to provide a second copy of the feedback information to the select circuit.

7. The apparatus of claim 6, further comprising:
    a first input path coupled between the select circuit and the first input node of the first pseudo-inverter to transfer at least one of the input information and the first copy of the feedback information to the first input node of the first pseudo-inverter; and
    a second input path coupled between the select circuit and the second input node of the first pseudo-inverter to transfer at least one of the input information and the second copy of the feedback information to the second input node of the first pseudo-inverter.

8. The apparatus of claim 7, wherein the first input path includes a first number of circuit elements, wherein the second input path includes a second number of circuit elements unequal to the first number of circuit elements.

9. The apparatus of claim 7, wherein the first input path has a first propagation delay, and wherein the second input path has a second propagation delay greater than the first propagation delay.

10. The apparatus of claim 7, wherein the select circuit includes:
    a first multiplexer to receive the input information and the first copy of the feedback information, and to provide one of the input information and the first copy of the feedback information to the first input node of the first pseudo-inverter; and
    a second multiplexer to receive the input information and the second copy of the feedback information, and to provide one of the input information and the second copy of the feedback information to the second input node of the first pseudo-inverter.

11. A system comprising:
a latch including,
   a pseudo-inverter including a first input node, a second input node, and an output node, the pseudo-inverter adapted to generate output information at the output node based on information coupled to the first and second input nodes;
   a feedback circuit to generate feedback information based on at least the output information, the feedback circuit including a second pseudo-inverter having a first input node coupled to the output node of the first pseudo-inverter, a second input node coupled to one of the first and second input nodes of the first pseudo-inverter, and an output node to provide a first copy of the feedback information to the select circuit; and
   a select circuit coupled to receive input information and the feedback information and to selectively transfer the input information and the feedback information to the first and second input nodes; and
a circuit board coupled to the latch, the circuit board including a terminal to couple to a battery to provide power to the latch.

12. The system of claim 11 further comprising a filter circuit located on a path between the select circuit and the first pseudo-inverter to block false information from altering the output information.

13. The system of claim 12, wherein the feedback circuit includes:
   a first feedback path to generate a first copy of the feedback information based on at least the output information, and to provide the first copy of the feedback information to the select circuit; and
   a second feedback path to generate a second copy of the feedback information based on at least the output information, and to provide the second copy of the feedback information to the select circuit.

14. A method comprising:
   transferring input information from a circuit node to a first input node and a second input node of a first pseudo-inverter during a first mode of the first pseudo-inverter;
   generating output information at an output node of the first pseudo-inverter based on information at the first and second input nodes; and
   generating feedback information based on at least the output information wherein generating the feedback information includes:
      receiving the output information at a first input node of a second pseudo-inverter;
      receiving an inversion of one of the input information and the feedback information at a second input node of the second pseudo-inverter; and
      generating the feedback information at an output node of the second pseudo-inverter based on information at the first and second input nodes of the second pseudo-inverter; and
   transferring the feedback information to the first and second input nodes during a second mode of the first pseudo-inverter.

15. The method of claim 14, wherein transferring the input information and transferring the feedback information includes:
   selecting between the input information and the feedback information to produce a selected information, the selected information being one of the input information and the feedback information;
   transferring the selected information to the first input node of the first pseudo-inverter at a first time; and
   transferring the selected information to the second input node of the first pseudo-inverter at a second time after the first time.

16. The method of claim 15, wherein transferring the selected information to the second input node of the first pseudo-inverter includes delaying the selected information before transferring the selected information to the second input node of the first pseudo-inverter.

17. The method of claim 14, wherein generating the feedback information further includes:
   receiving the output information at a first input node of a third pseudo-inverter;
   receiving an inversion of one of the input information and the feedback information at a second input node of the third pseudo-inverter;
   generating a first copy of the feedback information at the output node of the second pseudo-inverter, and generating a second copy of the feedback information at an output node of the third pseudo-inverter; and
   transferring the first copy of the feedback information to the first input node of the first pseudo-inverter, and transferring the second copy of the feedback information to the second input node of the first pseudo-inverter.

18. The method of claim 14, wherein transferring the input information and transferring the feedback information includes:
   selecting between the input information and a first copy of the feedback information to produce a first selected information, the first selected information being one of the input information and the first copy of the feedback information;
   selecting between the input information and a second copy of feedback information to produce a second selected information, the second selected information being one of the input information and the second copy of the feedback information;
   transferring the first selected information to the first input node of the first pseudo-inverter at a first time; and
   transferring the second selected information to the second input node of the first pseudo-inverter at a second time after the first time.

* * * * *